United States Patent
Moribe

(10) Patent No.: US 10,699,629 B2
(45) Date of Patent: Jun. 30, 2020

(54) DISPLAY DEVICE AND DISPLAY METHOD

(71) Applicant: MITSUBISHI ELECTRIC CORPORATION, Tokyo (JP)

(72) Inventor: Mikihito Moribe, Tokyo (JP)

(73) Assignee: MITSUBISHI ELECTRIC CORPORATION, Chiyoda-Ku, Tokyo (JP)

( * ) Notice: Subject to any disclaimer, the term of this patent is extended or adjusted under 35 U.S.C. 154(b) by 0 days.

(21) Appl. No.: 16/070,560

(22) PCT Filed: Aug. 3, 2016

(86) PCT No.: PCT/JP2016/072858
§ 371 (c)(1),
(2) Date: Jul. 17, 2018

(87) PCT Pub. No.: WO2017/134848
PCT Pub. Date: Aug. 10, 2017

(65) Prior Publication Data
US 2019/0027089 A1 Jan. 24, 2019

(30) Foreign Application Priority Data
Feb. 2, 2016 (JP) .................................. 2016-017781

(51) Int. Cl.
*G09G 3/32* (2016.01)
*G09G 3/20* (2006.01)
(Continued)

(52) U.S. Cl.
CPC ............. *G09G 3/32* (2013.01); *G09G 3/2003* (2013.01); *G09G 3/3426* (2013.01); *H01L 33/00* (2013.01);
(Continued)

(58) Field of Classification Search
CPC ............. G09G 3/32; G09G 2003/3426; G09G 2003/3413; H01L 33/00
See application file for complete search history.

(56) References Cited

U.S. PATENT DOCUMENTS

2002/0135547 A1 9/2002 Tanabe
2004/0027319 A1 2/2004 Kamikawa et al.
(Continued)

FOREIGN PATENT DOCUMENTS

CN 1656621 A 8/2005
CN 102770899 A 11/2012
(Continued)

OTHER PUBLICATIONS

International Search Report (PCT/ISA/210) dated Sep. 13, 2016, by the Japan Patent Office as the International Searching Authority for International Application No. PCT/JP2016/072858.
(Continued)

*Primary Examiner* — Ariel A Balaoing
(74) *Attorney, Agent, or Firm* — Buchanan Ingersoll & Rooney PC

(57) ABSTRACT

A display device includes light-emitting elements, current control elements, a power supply circuit, and a voltage control circuit. The current control elements are connected in series with the corresponding light-emitting elements and control current through the light-emitting elements. The power supply circuit applies a voltage to a series circuit that includes the light-emitting elements and the current control elements. The voltage control circuit controls an output voltage of the power supply circuit to reach a voltage value determined in accordance with forward voltages of the light-emitting elements.

8 Claims, 15 Drawing Sheets

(51) Int. Cl.
  *G09G 3/34* (2006.01)
  *H01L 33/00* (2010.01)
(52) U.S. Cl.
  CPC ... *G09G 3/3413* (2013.01); *G09G 2320/0242* (2013.01); *G09G 2320/0285* (2013.01); *G09G 2320/064* (2013.01); *G09G 2320/0633* (2013.01); *G09G 2320/0646* (2013.01); *G09G 2330/021* (2013.01); *G09G 2330/025* (2013.01); *G09G 2330/028* (2013.01); *G09G 2340/06* (2013.01); *G09G 2360/16* (2013.01)

(56) References Cited

U.S. PATENT DOCUMENTS

| | | | |
|---|---|---|---|
| 2005/0225515 A1 | 10/2005 | Tsuchida et al. | |
| 2006/0033452 A1* | 2/2006 | Yamazaki | G09G 3/3258 315/291 |
| 2007/0115210 A1 | 5/2007 | Kamikawa et al. | |
| 2011/0101881 A1 | 5/2011 | Kamikawa et al. | |
| 2011/0181500 A1* | 7/2011 | Liao | G09G 3/3208 345/76 |
| 2012/0212466 A1* | 8/2012 | Kohtoku | G02F 1/133385 345/207 |
| 2012/0274673 A1 | 11/2012 | Kamikawa et al. | |
| 2012/0299979 A1 | 11/2012 | Murai et al. | |
| 2014/0285533 A1* | 9/2014 | Chun | G09G 3/3208 345/690 |
| 2015/0206484 A1 | 7/2015 | Gotoh | |
| 2015/0359058 A1 | 12/2015 | Tsuchida et al. | |
| 2016/0381773 A1* | 12/2016 | Gyoten | H05B 33/0824 315/122 |
| 2017/0032745 A1 | 2/2017 | Sakai | |

FOREIGN PATENT DOCUMENTS

| | | |
|---|---|---|
| EP | 1950730 A2 | 7/2008 |
| EP | 2515291 A1 | 10/2012 |
| JP | 2001-144332 A | 5/2001 |
| JP | 2002-278496 A | 9/2002 |
| JP | 2004-006533 A | 1/2004 |
| JP | 2007-322945 A | 12/2007 |
| JP | 2011-009117 A | 1/2011 |
| JP | 2014-021287 A | 2/2014 |
| WO | WO 2015/098132 A1 | 7/2015 |

OTHER PUBLICATIONS

Written Opinion (PCT/ISA/237) dated Sep. 13, 2016, by the Japan Patent Office as the International Searching Authority for International Application No. PCT/JP2016/072858.
Office Action (Notification of Reasons for Refusal) dated Mar. 12, 2019, by the Japan Patent Office in corresponding Japanese Patent Application No. 2017-565387 and English translation of the Office Action. (6 pages).
Extended European Search Report dated Oct. 19, 2018, issued by the European Patent Office in corresponding European Application No. 16889332.9. (10 pages).
Office Action dated Feb. 3, 2020, by the Chinese Patent Office in corresponding Chinese Patent Application No. 201680080310.6 and English translation of the Office Action. (14 pages).

* cited by examiner

FIG.2B

| POSITION | IDENTIFICATION NUMBER | PIXEL VALUES |
|---|---|---|
| (0, 0) | 1 | GAR (0,0)、GAG(0,0)、GAB(0,0) |
| (1, 0) | 2 | GAR (1,0)、GAG(1,0)、GAB(1,0) |
| ⋮ | ⋮ | ⋮ |
| (N, 0) | N | GAR (N,0)、GAG(N,0)、GAB(N,0) |
| ⋮ | ⋮ | ⋮ |
| (N, M) | N × M | GAR (N,M)、GAG(N,M)、GAB(N,M) |

FRAME 0
FRAME 1

FIG.3A

| LUMINANCE | FIRST LUMINANCE-CURRENT CORRELATION TABLE | SECOND LUMINANCE-CURRENT CORRELATION TABLE | THIRD LUMINANCE-CURRENT CORRELATION TABLE |
|---|---|---|---|
| | CURRENT VALUE (R) | CURRENT VALUE (G) | CURRENT VALUE (B) |
| K[0](=L/J) | IR[0] | IG[0] | IB[0] |
| K[1](=L*2/J) | IR[1] | IG[1] | IB[1] |
| ⋮ | ⋮ | ⋮ | ⋮ |
| K[j](=L*j/J) | IR[j] | IG[j] | IB[j] |
| ⋮ | ⋮ | ⋮ | ⋮ |
| K[J](=L) | IR[J] | IG[J] | IB[J] |

FIG.4A

FIRST CURRENT-VOLTAGE
CORRELATION TABLE

| CURRENT (R) | FORWARD VOLTAGE |
|---|---|
| IR[0] | VfR[0] |
| IR[1] | VfR[1] |
| ⋮ | ⋮ |
| IR[j] | VfR[j] |
| ⋮ | ⋮ |
| IR[J] | VfR[J] |

FIG.4B

SECOND CURRENT-VOLTAGE
CORRELATION TABLE

| CURRENT (G) | FORWARD VOLTAGE |
|---|---|
| IG[0] | VfG[0] |
| IG[1] | VfG[1] |
| ⋮ | ⋮ |
| IG[j] | VfG[j] |
| ⋮ | ⋮ |
| IG[J] | VfG[J] |

FIG.4C

THIRD CURRENT-VOLTAGE
CORRELATION TABLE

| CURRENT (B) | FORWARD VOLTAGE |
|---|---|
| IB[0] | VfB[0] |
| IB[1] | VfB[1] |
| ⋮ | ⋮ |
| IB[j] | VfB[j] |
| ⋮ | ⋮ |
| IB[J] | VfB[J] |

FIG.11

| ILLUMINANCE | LUMINANCE SETTING |
|---|---|
| LESS THAN S1 | Y(SUM) [0] |
| FROM S1 TO LESS THAN S2 | Y(SUM) [1] |
| ⋮ | ⋮ |
| FROM Sk TO LESS THAN Sk+1 | Y(SUM) [k] |
| ⋮ | ⋮ |

DISPLAY DEVICE AND DISPLAY METHOD

TECHNICAL FIELD

The present disclosure relates to a display device and a display method.

BACKGROUND ART

A backlit display device is proposed that adjusts the overall luminance of a backlight having light-emitting diodes (LEDs) by control of a magnitude of current through each LED (see, for example, Patent Literature 1). In such a display device, the LEDs and current control elements for controlling the magnitudes of currents through the LEDs are connected in series with a power supply that outputs a constant voltage. This display device can achieve lower power loss than a display device that adjusts luminance by pulse width modulation (PWM) control while a current to be supplied to each LED is kept constant.

CITATION LIST

Patent Literature

Patent Literature 1: Unexamined Japanese Patent Application Kokai Publication No. 2007-322945

SUMMARY OF INVENTION

Technical Problem

The display device disclosed in Patent Literature 1, however, may result in increased power loss at the current control elements because the constant output voltage of the power supply causes high voltage drops across the current control elements when currents through the LEDs have small current values and voltage drops across the LEDs are low.

The present disclosure is made to solve the problem described above, and thus an objective of the present disclosure is to provide a display device with reduced power loss.

Solution to Problem

To achieve the foregoing objective, the present disclosure provides a display device comprising:

a light-emitting element, a current control element connected in series with the light-emitting element to control a current through the light-emitting element, a power supply circuit to apply a voltage to a series circuit that includes the light-emitting element and the current control element, and a voltage control circuit to control output voltage of the power supply circuit to reach a voltage value determined in accordance with a forward voltage of the light-emitting element.

Advantageous Effects of Invention

According to the present disclosure, the voltage control circuit controls the output voltage of the power supply circuit in accordance with the forward voltages of the light-emitting elements. This reduces the voltage drops across the current control elements and thus reduces the power loss at the current control elements, and as a result, reduces the power loss of the entirety of the display device.

BRIEF DESCRIPTION OF DRAWINGS

FIG. 2B is a diagram illustrating an example of pixel data of one frame of the display device according to the embodiment;

FIG. 3A is a diagram illustrating a luminance-current correlation table according to the embodiment;

FIG. 4A is a diagram illustrating a first current-voltage correlation table according to the embodiment;

FIG. 4B is a diagram illustrating a second current-voltage correlation table according to the embodiment;

FIG. 4C is a diagram illustrating a third current-voltage correlation table according to the embodiment;

FIG. 11 is a diagram illustrating an example of a luminance settings table according to the still yet another variation.

DESCRIPTION OF EMBODIMENTS

Embodiments of a display device according to the present disclosure are described below with reference to the drawings.

A display device according to an embodiment of the present disclosure acquires video data including data of frames from a source outside of the display device, and controls currents through LEDs of a display unit based on data of each frame and a luminance setting. The display device also adjusts the magnitude of an output voltage of a power supply circuit for supply of current to the LEDs in accordance with the magnitudes of currents through the LEDs.

Figure 1:
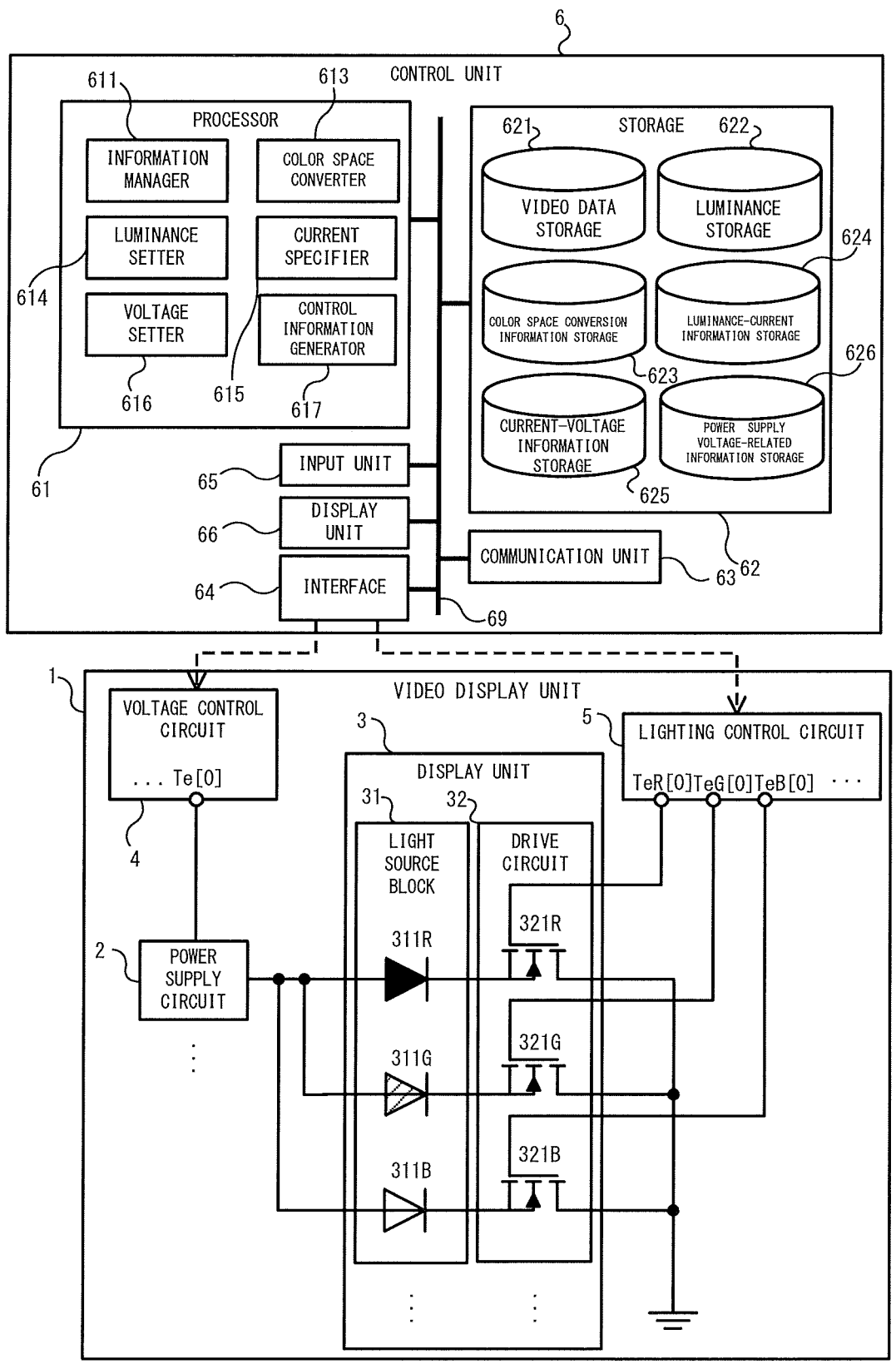
FIG. 1 is a block diagram illustrating a configuration of a display device according to an embodiment of the present disclosure.
Figure 2A:
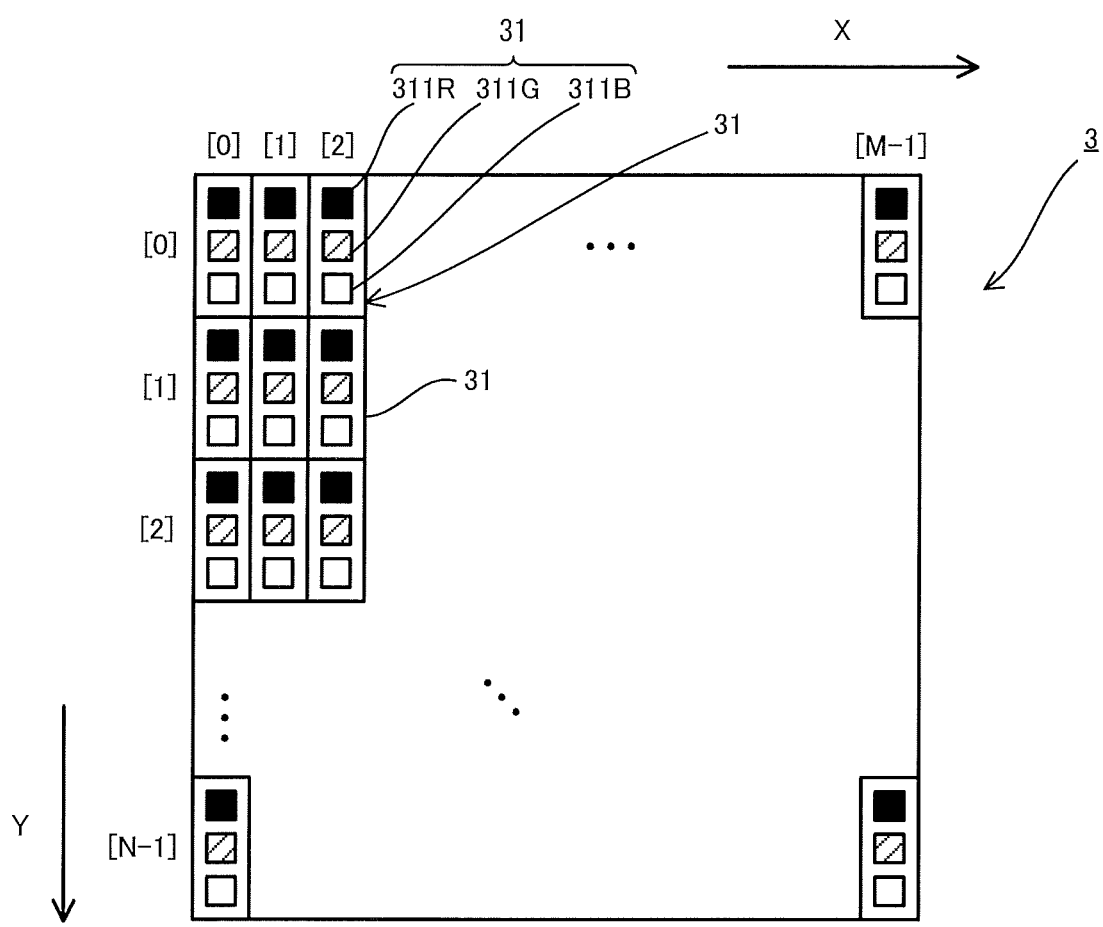
FIG. 2A is a schematic diagram illustrating a display unit of the display device according to the embodiment.

As illustrated in FIG. 1, the display device includes a video display unit 1 that displays video associated with data of each frame, and a control unit 6 that controls the video display unit 1. The video display unit 1 includes a display unit 3, power supply circuits 2, a voltage control circuit 4, and a lighting control circuit 5. The display unit 3 includes light source blocks 31 and drive circuits 32, each drive circuit 32 corresponding to one of the light source blocks 31. Each light source block 31 includes three types of light-emitting elements 311R, 311G, and 311B. Each of these light-emitting elements 311R, 311G, 311B includes an LED having a pn junction. The light-emitting element (first light-emitting element) 311R emits light having a wavelength band of red light including a 700-nm wavelength. The light-emitting element (second light-emitting element) 311G emits light having a wavelength band of green light including a 546.1-nm wavelength. The light-emitting element (third light-emitting element) 311B emits light having a wavelength band of blue light including a 435.8-nm wavelength. As illustrated in FIG. 2A, the light source blocks 31 are arranged in a two-dimensional matrix with M rows and N columns when the number of pixels of the display unit 3 is set to N×M.

Referring again to FIG. 1, each drive circuit 32 includes current control elements 321R, 321G, and 321B that are connected in series to the three light-emitting elements 311R, 311G, and 311B, respectively, to control currents therethrough. The current control elements 321R, 321G, and 321B include a field-effect transistor (FET) and/or a bipolar transistor. FIG. 1 illustrates the current control elements 321R, 321G, and 321B each including an N-channel type FET.

The power supply circuit 2 applies a voltage to a series circuit that includes the light-emitting elements 311R, 311G, and 311B and the current control elements 321R, 321G, and 321B. The power supply circuit 2 is provided one to every light source blocks 31. Each power supply circuit 2 includes a switching regulator and outputs a voltage corresponding to a duty cycle of a PWM signal input from the voltage control circuit 4.

The voltage control circuit 4 controls the output voltage of the power supply circuit 2 to reach a voltage value determined in accordance with forward voltages of the light-emitting elements 311R, 311G, and 311B. The voltage control circuit 4 generates a PWM signal having a frequency and a duty cycle that are indicated by voltage control information received from the control unit 6, and outputs the generated PWM signal to the power supply circuit 2. The voltage control circuit 4 outputs each of the PWM signals to the corresponding power supply circuits 2.

The lighting control circuit 5 receives lighting control information from the control unit 6 and applies a voltage corresponding to the lighting control information to output terminals TeR[i], TeG[i], and TeB[i] (i=0, 1, 2, . . . , N×M). The output terminals TeR[i], TeG[i], and TeB[i] are connected to gates of the current control elements 321R, 321G, and 321B of the drive circuit 32.

The control unit 6 includes a processor 61, a storage 62, a communication unit 63, an interface 64, an input unit 65, a display unit 66, and a bus 69 that connects each of the components with one another. The processor 61 includes a central processing unit (CPU) and a random access memory (RAM). The communication unit 63 receives video data from a video transmission device (not illustrated). The input unit 65 includes input keys and receives a user operation. The input unit 65 sends received information to the processor 61. The display unit 66 includes a display and displays data received from the processor 61.

The interface 64 sends to the voltage control circuit 4 the voltage control information received from the processor 61, and sends to the lighting control circuit 5 current control information received from the processor 61.

The storage 62 includes a non-volatile memory such as a magnetic disk or a semiconductor memory. The storage 62 includes a video data storage (pixel value information storage) 621, a luminance storage 622, a color space conversion information storage 623, a luminance-current information storage 624, a current-voltage information storage 625, and a power-supply-voltage-related information storage 626.

The storage 62 stores various programs to be executed by the CPU of the processor 61. The video data storage 621 stores video data including data of frames. The data of each frame includes pixel value information that indicates pixel values in the RGB color system for each of the corresponding light source blocks 31 included in the display unit 3. In the data of each frame, as illustrated in FIG. 2B, RGB pixel values for each light source block 31 are each associated with positional information of the light source block 31. The positional information illustrated in FIG. 2B has an X-coordinate corresponding to the column number in FIG. 2A and a Y-coordinate corresponding to the row number in FIG. 2A. Each pixel value is also associated with a unique identification number assigned to the corresponding light source block 31.

Referring again to FIG. 1, the luminance storage 622 stores a user-specified overall luminance setting of the light source blocks 31. The luminance setting is input by a user via the input unit 65.

The color space conversion information storage 623 stores information regarding a conversion equation for converting the pixel value in the RGB color system defined by the International Commission on Illumination (CIE) into the coordinate value in the XYZ color system. The conversion equation is given by the following equation (1):

$$X = (C11 \times GAR + C12 \times GAG + C13 \times GAB)/GAM \times L$$

$$Y = (C21 \times GAR + C22 \times GAG + C23 \times GAB)/GAM \times L$$

$$Z = (C31 \times GAR + C32 \times GAG + C33 \times GAB)/GAM \times L \qquad \text{Equation (1)}$$

where L is a maximum luminance for each of the light-emitting elements 311R, 311G, and 311B, and GAM is gradation. For a 256-level gradation pixel value, GAM is set to 256. The color space conversion information storage 623 stores information indicating configuration of the conversion equation and values of coefficients C11, C12, C13, C21, C22, C23, C31, C32, and C33. The coefficients C11, C12, C13, C21, C22, C23, C31, C32, and C33 are set to 0.4898, 0.3101, 0.2001, 0.1769, 0.8124, 0.0107, 0, 0.01, and 0.9903, respectively.

Figure 3B:
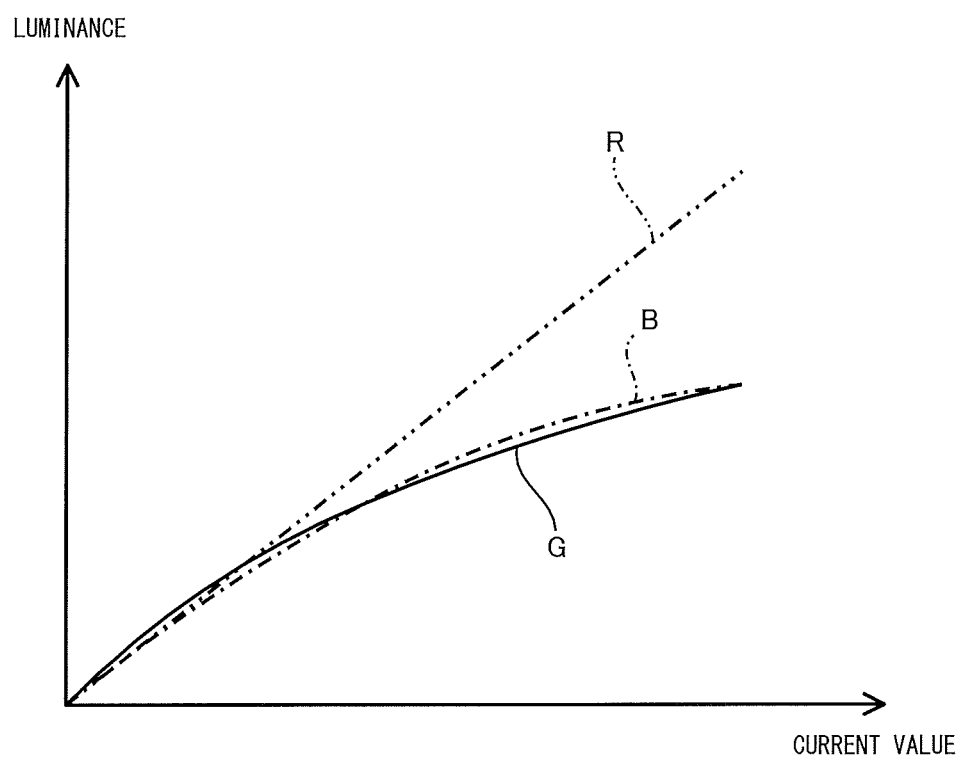
FIG. 3B is a graph illustrating a correlation between a luminance of light-emitting elements and a current value of current through the light-emitting elements according to the embodiment.

The luminance-current information storage 624 stores a luminance-current correlation table (luminance-current correlation information) as illustrated in FIG. 3A, indicating correlation between the luminances of the light-emitting elements 311R, 311G, and 311B and current values of current through the light-emitting elements 311R, 311G, and 311B. The luminance-current correlation table includes a first luminance-current correlation table for the light-emitting element 311R, a second luminance-current correlation table for the light-emitting element 311G, and a third luminance-current correlation table for the light-emitting element 311B. FIG. 3A indicates the three luminance-current correlation tables combined together into one table. Since visual sensitivity in humans changes according to the wavelength band, the correlations between the luminances of the light-emitting elements 311R, 311G, and 311B and the current values of current through the light-emitting elements 311R, 311G, and 311B are different from one another as illustrated in FIG. 3B. In FIG. 3B, plot R indicates a correlation between the luminance and the current value of the light-emitting element 311R, plot G indicates a correlation between the luminance and the current value of the light-emitting element 311G, and plot B indicates a correlation between the luminance and the current value of the light-emitting element 311B. Even the current values IR[j], IG[j], and IB[j] of current through the light-emitting elements 311R, 311G, and 311B that are associated with the same luminance k[j] as in FIG. 3A may be different.

Referring again to FIG. 1, the current-voltage information storage 625 stores current-voltage tables (current-voltage correlation information) that indicates correlations between the current values of current through the light-emitting elements 311R, 311G, and 311B and the corresponding forward voltages of the light-emitting elements 311R, 311G, and 311B. These current-voltage tables for the corresponding light-emitting elements 311R, 311G, and 311B as illustrated in FIGS. 4A to 4C have correlations that are different from one another due to the respective different current-voltage characteristics of the light-emitting elements 311R, 311G, and 311B.

Referring again to FIG. 1, the power supply voltage-related information storage 626 stores a margin voltage value for use in setting both the voltage value of the power supply voltage and the set voltage value of the power supply voltage. The margin voltage value corresponds to a difference between the voltage value of the power supply voltage and a voltage value (hereinafter referred to as "Vf maximum value") that is the highest among the forward voltages of the three light-emitting elements 311R, 311G, and 311B.

The processor 61 serves as an information manager 611, a color space converter 613, a luminance setter 614, a current specifier 615, a voltage setter 616, and a control information generator 617 by the CPU loading a program stored in the storage 62 into RAM and executing the program.

The information manager 611 manages video data stored in the video data storage 621 and luminance information stored in the luminance storage 622. The information manager 611 presents a user with various operation screens through the display unit 66. Upon a user inputting a video data acquisition command via the input unit 65 while viewing an operation screen of the display unit 66, the information manager 611 acquires the video data via the communication unit 63 from a video transmission device and stores the acquired video data into the video data storage 621. Upon a user inputting the overall luminance setting of the light source blocks 31 via the input unit 65 while viewing the operation screen of the display unit 66, the information manager 611 also stores the input luminance setting into the luminance storage 622.

The color space converter 613 acquires from the video data storage 621 frame data of one frame included in the video data. The color space converter 613 then calculates coordinate values in the XYZ color system from the pixel values in the RGB color system included in the frame data using the conversion equation indicated by the information stored in the color space conversion information storage 623.

The luminance setter 614 acquires from the luminance storage 622 the luminance information indicating the luminance setting, and calculates new Y-coordinate values for the corresponding light source blocks 31 so that the sum of the Y-coordinate values in the XYZ color system for the corresponding light source blocks 31 is equal to the luminance setting. Specifically, the luminance setter 614 calculates the new Y-coordinate values for the corresponding light source blocks 31 using the relationship of the following equation (2):

$$Y(NEW)[i]=Y(SUM)\times(Y[i]/\Sigma Y[i])(i=1,2,\ldots,N\times M) \quad \text{Equation (2)}$$

where Y(NEW)[i] is a new Y-coordinate value corresponding to the light source block 31 having the identification number i, Y(SUM) is the luminance setting, and ΣY[i] is the sum of the Y-coordinate values calculated by the color space converter 613 from the pixel values included in the frame data.

The luminance setter 614 sets the luminances of the light-emitting elements 311R, 311G, and 311B for each of the corresponding light source blocks 31 using the calculated new Y-coordinate values and the relationships of the following equation (3):

$$K(R)[i]=L\times(Y(NEW)[i]/Y[i])\times GAR/GAM$$

$$K(G)[i]=L\times(Y(NEW)[i]/Y[i])\times GAG/GAM$$

$$K(B)[i]=L\times(Y(NEW)[i]/Y[i])\times GAB/GAM \qquad \text{Equation (3)}$$

where K(R)[i], K(G)[i], and K(B)[i] are luminances of the light-emitting elements 311R, 311G, and 311B of the light source block 31 having the identification number i.

The current specifier 615 refers to the first luminance-current correlation table stored in the luminance-current information storage 624 and specifies the current value IR[j] corresponding to the luminance of the light-emitting element 311R set by the luminance setter 614. The current specifier 615 also refers to the second luminance-current correlation table stored in the luminance-current information storage 624 and specifies the current value IG[j] corresponding to the luminance of the light-emitting element 311G set by the luminance setter 614. The current specifier 615 also refers to the third luminance-current correlation table stored in the luminance-current information storage 624 and specifies the current value IB[j] corresponding to the luminance of the light-emitting element 311B set by the luminance setter 614. The current specifier 615 specifies the current values IR[j], IG[j], and IB[j] for all the light source blocks 31 included in the display unit 3.

First, the voltage setter 616 refers to the current-voltage correlation table stored in the current-voltage information storage 625 and specifies the forward voltages of the light-emitting elements 311R, 311G, and 311B corresponding to the current values IR[j], IG[j], and IB[j] specified by the current specifier 615 for each of the light source blocks 31. Next, the voltage setter 616 specifies the Vf maximum value that is the highest voltage value among the forward voltages of the three light-emitting elements 311R, 311G, and 311B for each of the corresponding light source blocks 31. The voltage setter 616 then acquires information indicating the margin voltage value stored in the power supply voltage-related information storage 626, and stores, in the power supply voltage-related information storage 626, the voltage value obtained by addition of the margin voltage value to the specified Vf maximum value as the voltage value of the power supply voltage.

The control information generator 617 generates the current control information that defines the gate voltages to be applied by the lighting control circuit 5 to the gates of the current control elements 321R, 321G, and 321B of the drive circuit 32. The control information generator 617 then transmits the generated current control information via the interface 64 to the lighting control circuit 5. The current control information indicates the gate voltages corresponding to the current values IR[j], IG[j], and IB[j] specified by the current specifier 615. The control information generator 617 also generates the voltage control information that defines a frequency and a duty cycle of a PWM signal to be output by the voltage control circuit 4 to the power supply circuit 2. The duty cycle corresponds to the power supply voltage set by the voltage setter 616. The control information generator 617 then transmits the generated voltage control information via the interface 64 to the voltage control circuit 4.

Video display processing executed by the control unit 6 according to the present embodiment is described below with reference to FIGS. 5 and 6. Here, the video data storage 621 is assumed to have previously stored the video data, and the luminance storage 622 is assumed to have previously stored information indicating the luminance setting. The video display processing begins when a user executes, via the input unit 65, an operation to start the video display processing.

Figure 5:
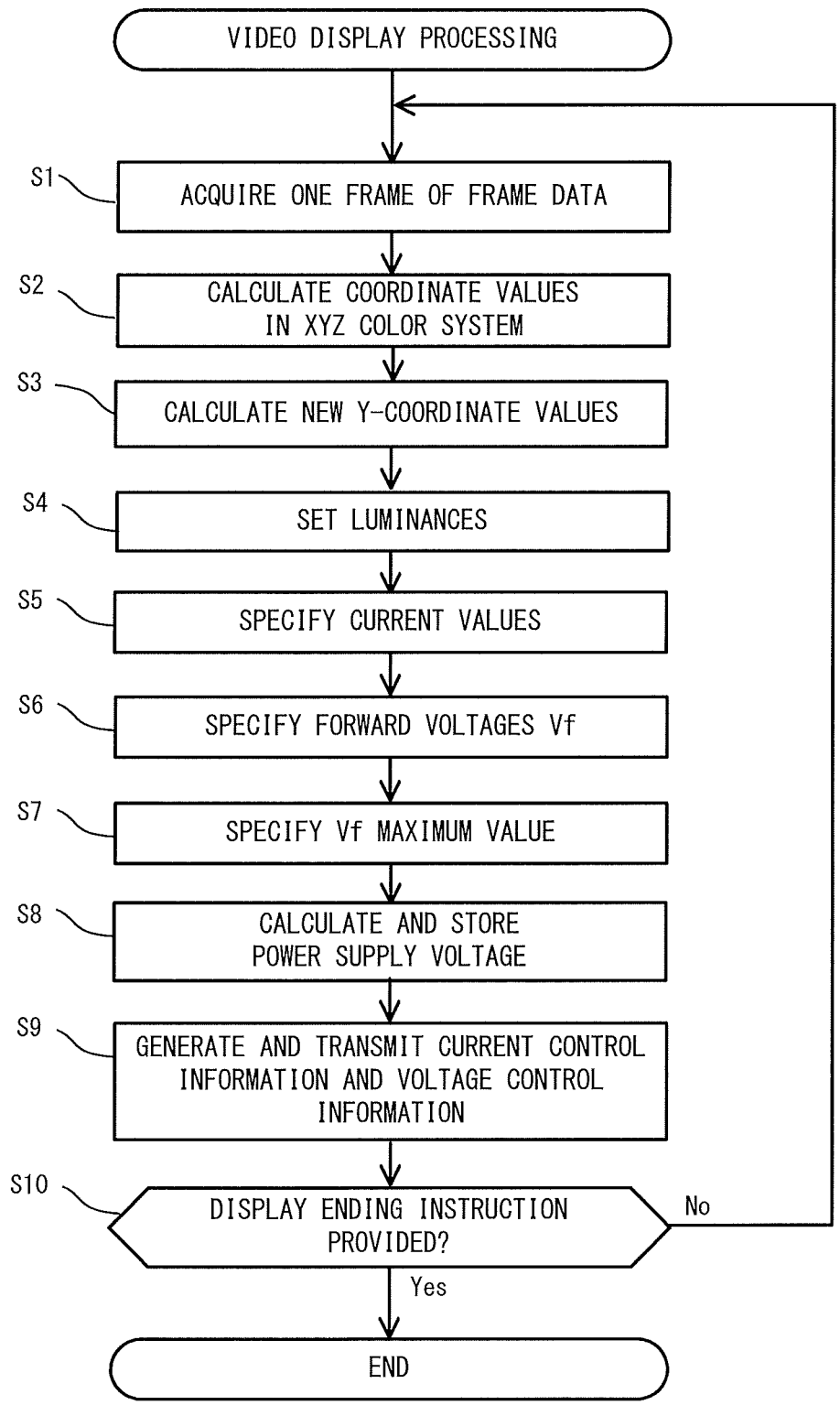
FIG. 5 is a flowchart illustrating a flow of a video display process according to the embodiment.

First, the color space converter 613 acquires from the video data storage 621 frame data of one frame, as illustrated in FIG. 5 (step S1). Then, the color space converter 613 refers to the information regarding the conversion equation stored in the color space conversion information storage 623, and calculates a coordinate value in the XYZ color system from the pixel value in the RGB color system (step S2). The color space converter 613 calculates the coordinate value in the XYZ color system using the relationships of the above-described equation (1) for each of the light source blocks 31.

Next, the luminance setter 614 acquires the luminance setting from the luminance storage 622, and calculates new Y-coordinate values so that the sum of the Y-coordinate values in the XYZ color system for all the corresponding pixels of the display unit 3 is equal to the luminance setting (step S3). The luminance setter 614 calculates new Y-coordinate values for the corresponding light source blocks 31 using the relationship of the above-described equation (2). The luminance setter 614 then sets the luminances of the light-emitting elements 311R, 311G, and 311B for each of all the corresponding light source blocks 31 included in the display unit 3 using the calculated new Y-coordinate values (step S4). The luminance setter 614 sets the luminances of the light-emitting elements 311R, 311G, and 311B of each of the corresponding light source blocks 31 using the relationships of the above-described equation (3).

Next, the current specifier 615 refers to the luminance-current correlation table stored in the luminance-current information storage 624, and specifies the current values IR[j], IG[j], and IB[j] corresponding to the luminances of the light-emitting elements 311R, 311G, and 311B set by the luminance setter 614 (step S5).

Subsequently, the voltage setter 616 refers to the power supply voltage table stored in the current-voltage information storage 625, and specifies, for each light source block 31, the forward voltages Vf corresponding to the current values IR[j], IG[j], and IB[j] specified by the current specifier 615 (step S6).

Then, the voltage setter 616 specifies the Vf maximum value for each light source block 31 (step S7). The voltage setter 616 then acquires the information indicating the margin voltage value from the power supply voltage-related information storage 626, calculates the voltage value of the power supply voltage by adding the margin voltage value to the specified Vf maximum value, and stores the calculated voltage value in the power supply voltage-related information storage 626 (step S8).

Subsequently, the control information generator 617 generates current control information and transmits the current control information to the lighting control circuit 5, and generates voltage control information and transmits the voltage control information to the voltage control circuit 4 (step S9). The voltage control circuit 4 controls, upon receiving the voltage control information, the output voltage of the power supply circuit 2 so as to reach the voltage value of the power supply voltage set by the voltage setter 616.

Next, the color space converter 613 determines whether a display ending instruction for ending the video display is provided (step S10). The display ending instruction is input by a user via the input unit 65. When the color space converter 613 determines that the display ending instruction is not provided (No in step S10), then the processing of step S1 and the subsequent steps is executed again. When the color space converter 613 determines that the display ending instruction is provided (Yes in step S10), the video display processing ends.

Figure 6:
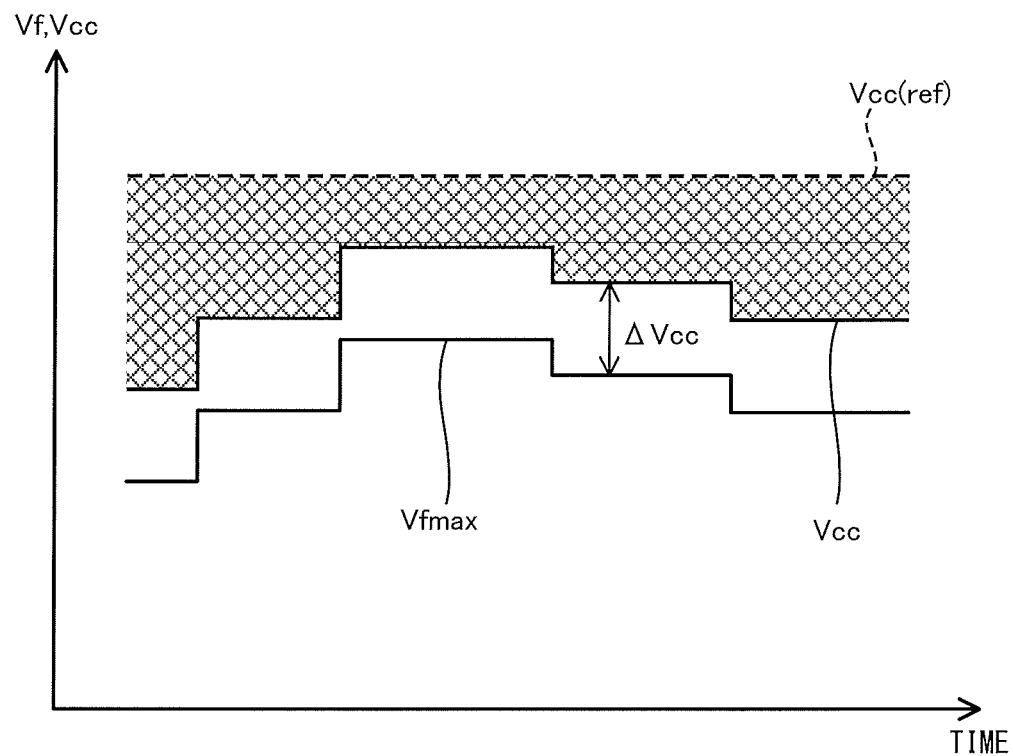
FIG. 6 is a diagram illustrating an operation of the display device according to the embodiment.

During repeated execution of the processing of steps 1 to 10, the level of the output voltage Vcc of the power supply circuit 2 increases and decreases as the Vf maximum (Vfmax) of the light source block 31 increases and decreases, as illustrated in FIG. 6. This achieves lower voltage drops across the current control elements 321R, 321G, and 321B than those of the power supply circuit 2 with the output voltage being a constant voltage Vcc(ref) (see crosshatched portion in FIG. 6). Reduction in the voltage drops across the current control elements 321R, 321G, and 321B accordingly results in reduction in power loss at the current control elements 321R, 321G, and 321B.

In the display device according to the present embodiment as described above, the voltage control circuit 4 controls the output voltage of the power supply circuit 2 in accordance with the forward voltages Vf of the light-emitting elements 311R, 311G, and 311B. This reduces the voltage drops across the current control elements 321R, 321G, and 321B and thus reduces the power loss at the current control elements 321R, 321G, and 321B. As a result, the power loss of the entirety of the display device is reduced.

The reduction in the voltage drops across the current control elements 321R, 321G, and 321B leads to the reduction in an amount of heat generation of the current control elements 321R, 321G, and 321B. The reduction in the amount of heat generation can inhibit temperature increases of the light-emitting elements 311R, 311G, and 311B that may otherwise be caused by heat generated by the current control elements 321R, 321G, and 321B, which inhibits changes in chromaticity of the light source blocks 31 due to the temperature characteristics of the light-emitting elements 311R, 311G, and 311B.

The control unit 6 according to the present embodiment includes the luminance-current information storage 624 for storing the luminance-current correlation tables of the light-emitting elements 311R, 311G, and 311B, and the current-voltage information storage 625 for storing the current-voltage correlation tables of the light-emitting elements 311R, 311G, and 311B. Therefore, in a case where the light-emitting elements 311R, 311G, and 311B are of different specifications, such a configuration can be accommodated simply by appropriately changing contents of the luminance-current correlation tables and the current-voltage correlation tables. Thus a user can relatively easily change the light-emitting elements 311R, 311G, and 311B to those with different specifications.

The luminance-current information storage 624 according to the present embodiment stores the first luminance-current correlation table for the light-emitting element 311R, the second luminance-current correlation table for the light-emitting element 311G, and the third luminance-current correlation table for the light-emitting element 311B. Thus the current values of current through the light-emitting elements 311R, 311G, and 311B are set based on the differences of the correlations between the luminances and the current values due to the different wavelength bands of light emission for the light-emitting elements 311R, 311G, and 311B. This setting thus prevents a chromaticity shift due to change in overall luminance of the display unit 3, thereby advantageously maintaining the image quality of the display unit 3.

The luminance setter 614 according to the present embodiment sets the luminances of the light-emitting elements 311R, 311G, and 311B of each of the light source blocks so that the sum of the Y-coordinate values in the XYZ color system for the corresponding light source blocks 31 is equal to the luminance setting. This setting of the luminances of the light-emitting elements 311R, 311G, and 311B enables the overall luminance of the display unit 3 to be maintained constant, thereby advantageously maintaining the image quality of the display unit 3.

The voltage setter 616 according to the present embodiment sets the output voltage of each power supply circuit 2 based on the Vf maximum value that is the highest voltage value among the forward voltages of the light-emitting elements 311R, 311G, and 311B for each of the corresponding light source blocks 31. This setting of the output voltage of each power supply circuit 2 prevents any of the light-emitting elements 311R, 311G, and 311B from going off due to undervoltage, thereby advantageously maintaining the image quality of the display unit 3.

Variations

Figure 7:
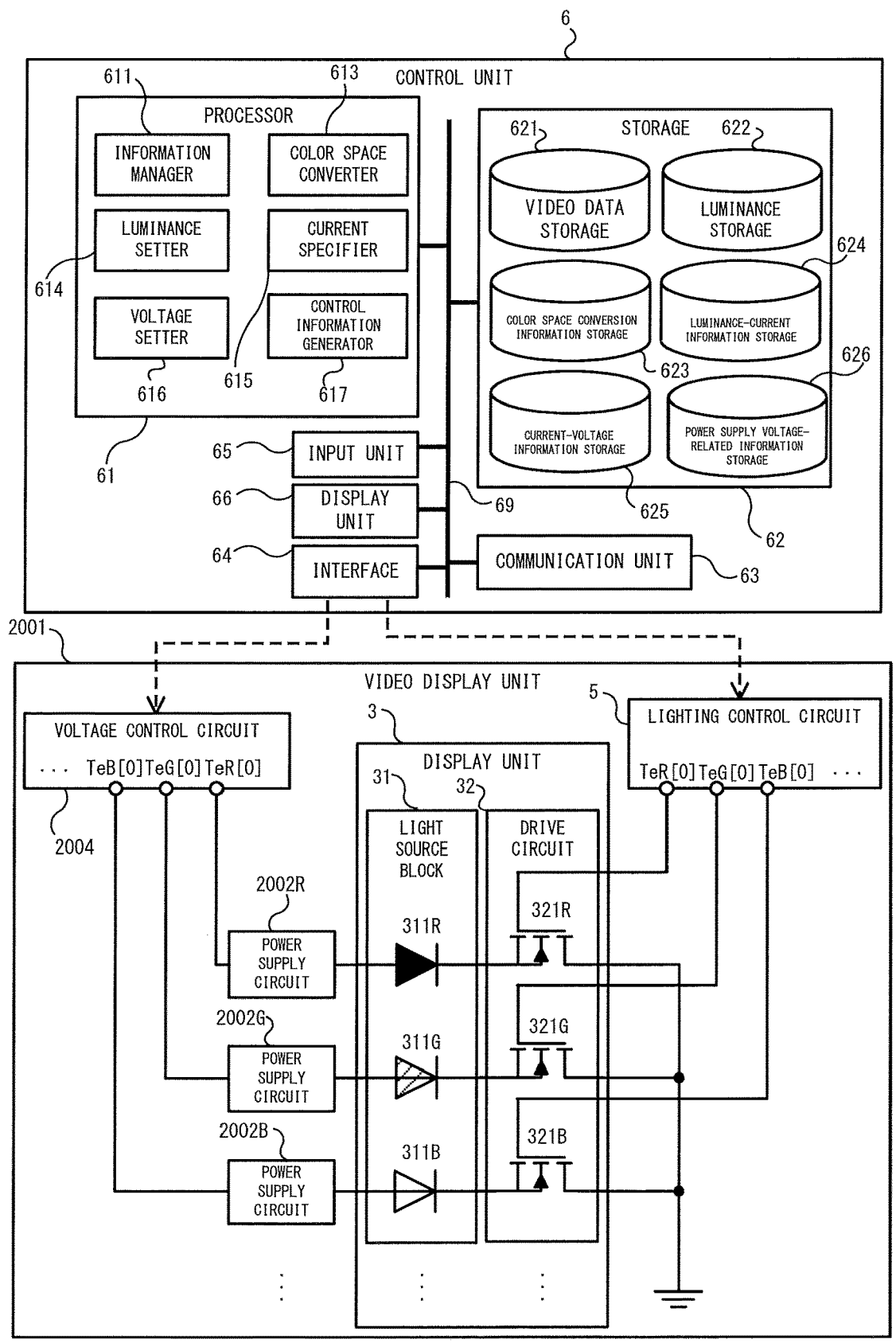
FIG. 7 is a block diagram illustrating a configuration of a display device according to a variation.

Although embodiments of the present disclosure are described above, the present disclosure is not limited to the embodiments above. As illustrated in FIG. 7, the video display unit 2001 may include light source blocks 31 each including the light-emitting element 311R, 311G, and 311B configured to receive power from their corresponding power supply circuits 2002R, 2002G, and 2002B. A voltage control circuit 2004 includes output terminals TeR[i], TeG[i], and TeB[i] connected to the corresponding power supply circuits 2002R, 2002G, and 2002B, and outputs PWM signals individually to the corresponding power supply circuits 2002R, 2002G, and 2002B. The power supply voltage-related information storage 626 individually stores the voltage values of the power supply voltages for the corresponding light-emitting elements 311R, 311G, and 311B of each of the light source blocks 31.

In the video display processing executed by the control unit 6 according to the variation, step S7 of the above-described video display processing that is illustrated in the flowchart of FIG. 5 is omitted. In addition, the processing for setting the power supply voltages for the corresponding three light-emitting elements 311R, 311G, and 311B for each of the light source blocks 31 is executed instead of the processing of step S8. Specifically, the voltage setter 616 acquires information indicating the margin voltage values from the power supply voltage-related information storage 626, and calculates the voltage values of the power supply voltages for the corresponding light-emitting elements 311R, 311G, and 311B by adding the margin voltage values to the forward voltages of the corresponding light-emitting elements 311R, 311G, and 311B specified in the processing of step S6 in FIG. 5.

This configuration achieves setting of the optimum power supply voltages for each of the light-emitting elements 311R, 311G, and 311B. The setting of the optimum power supply voltages provides lower voltage drops across the current control elements 321R, 321G, and 321B of the drive circuit 32 than those in the above-described embodiments, thereby advantageously reducing the power loss at the current control elements 321R, 321G, and 321B.

Figure 8:
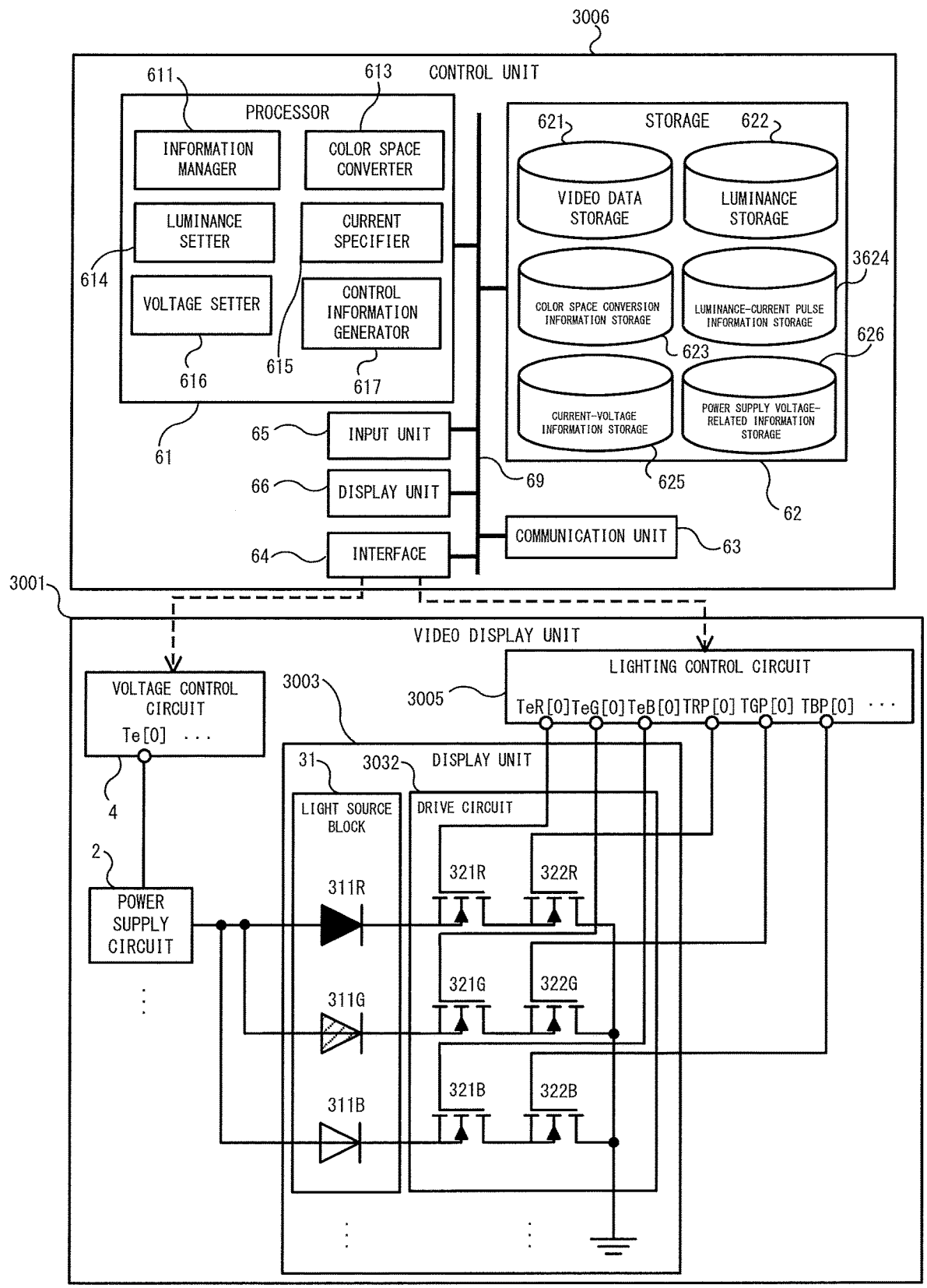
FIG. 8 is a block diagram illustrating a configuration of a display device according to another variation.

Although the above-described embodiments describe examples of the drive circuit 32 as including the current control elements 321R, 321G, and 321B, the configuration of the drive circuit is not limited thereto. For example, FIG. 8 illustrates another example configuration of a video display unit 3001 in which a drive circuit 3032 of a display unit 3003 includes switching elements 322R, 322G, and 322B for PWM control in addition to the current control elements 321R, 321G, and 321B. The switching elements 322R, 322G, and 322B may include a FET and/or a bipolar transistor. FIG. 8 illustrates the switching elements 322R, 322G, and 322B as including N-channel FETs.

A lighting control circuit 3005 includes, in addition to the TeR[i], TeG[i], and TeB[i], output terminals TRP[i], TGP[i], and TBP[i] for output of PWM signals to gates of the switching elements 322R, 322G, and 322B. The lighting control circuit 3005 controls lighting time of the light-emitting elements 311R, 311G, and 311B by changing duty cycles of the PWM signals that are to be output to the switching elements 322R, 322G, and 322B.

A control unit 3006 includes a luminance-current-pulse information storage 3624 for storing luminance tables that associate the luminances of the light-emitting elements 311R, 311G, and 311B with combinations of the current values of current through the light-emitting elements 311R, 311G, and 311B and duty cycles of PWM signals. The control information generator 617 generates the current control information that defines the gate voltages to be applied to the gates of the current control elements 321R, 321G, and 321B and the duty cycles of the PWM signals to be output to the switching elements 322R, 322G, and 322B, and transmits the generated current control information to the lighting control circuit 3005.

In this configuration, the lighting control circuit 3005 controls the current through the light-emitting elements 311R, 311G, and 311B using the current control elements 321R, 321G, and 321B, and controls the lighting time of the light-emitting elements 311R, 311G, and 311B using the switching elements 322R, 322G, and 322B. This control provides wider variable ranges of the luminances of the light-emitting elements 311R, 311G, and 311B than those of the above-described embodiments, thereby advantageously providing a greater degree of freedom in setting the overall luminance of the display unit 3003.

Figure 9:
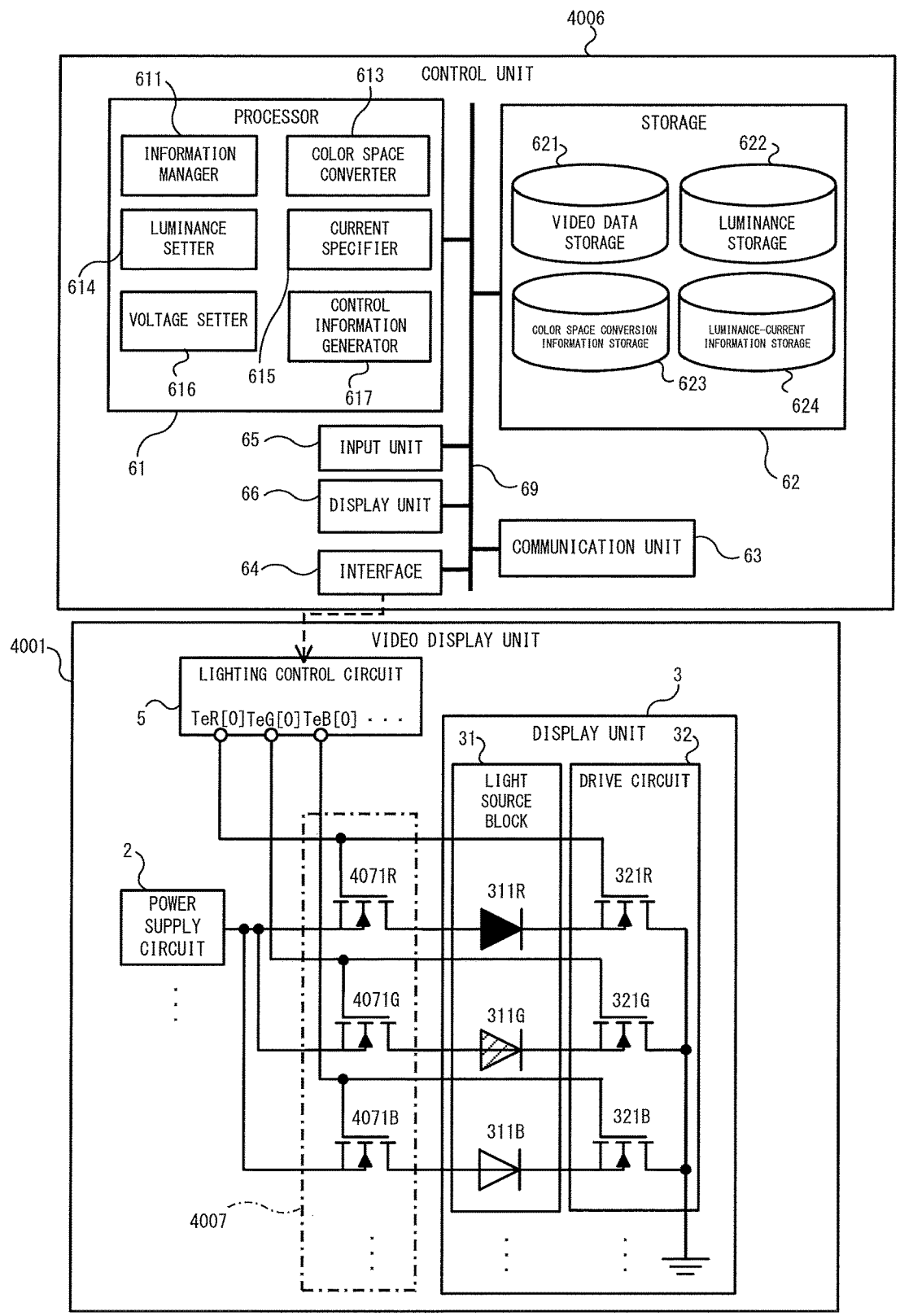
FIG. 9 is a block diagram illustrating a configuration of a display device according to yet another variation.

The above-described embodiments describes examples of the video display unit 1 as including the voltage control circuit 4 that controls the output voltage of the power supply circuit 2 based on the voltage control information received from the control unit 6. The voltage control circuit, however, is not limited to the configuration in which the output voltage of the power supply circuit 2 is controlled based on the voltage control information received from the control unit 6. FIG. 9 illustrates another example configuration of a video display unit 4001 in which a voltage control circuit 4007 includes current control elements 4071R, 4071G, and 4071B that are inserted between the power supply circuit 2 and the light-emitting elements 311R, 311G, and 311B of the light source block 31. The current control elements 4071R, 4071G, and 4071B may include a FET and/or a bipolar transistor. The current control elements 4071R, 4071G, and 4071B illustrated in FIG. 9 include N-channel FETs. The current control elements 4071R, 4071G, and 4071B have the same characteristics as the current control elements 321R, 321G, and 321B, and include gates connected to the output terminals TeR[i], TeG[i], and TeB[i] of the lighting control circuit 5. In this variation, the voltage drops across the current control elements 4071R, 4071G, and 4071B of the drive circuit 32 are halved compared to those of the above-described embodiments. In addition, the current-voltage information storage 625 and the power supply voltage-related information storage 626 of the control unit 6 according to the above-described embodiments are omitted in the control unit 4006.

The voltage control circuit 4007 may include P current control elements 4071R, P current control elements 4071G, and P current control elements 4071B, where P is a positive integer, inserted between the power supply circuit 2 and the corresponding light-emitting elements 311R, 311G, and 311B. In this case, the voltage drops across the current control elements 4071R, 4071G, and 4071B of the drive circuit 32 decrease to 1/P times the voltage drops of the above-described embodiments.

This configuration eliminates the need for the current-voltage information storage 625 and the power supply voltage-related information storage 626 in the control unit 4006, thereby advantageously reducing required storage capacity for the storage 62.

Figure 10:
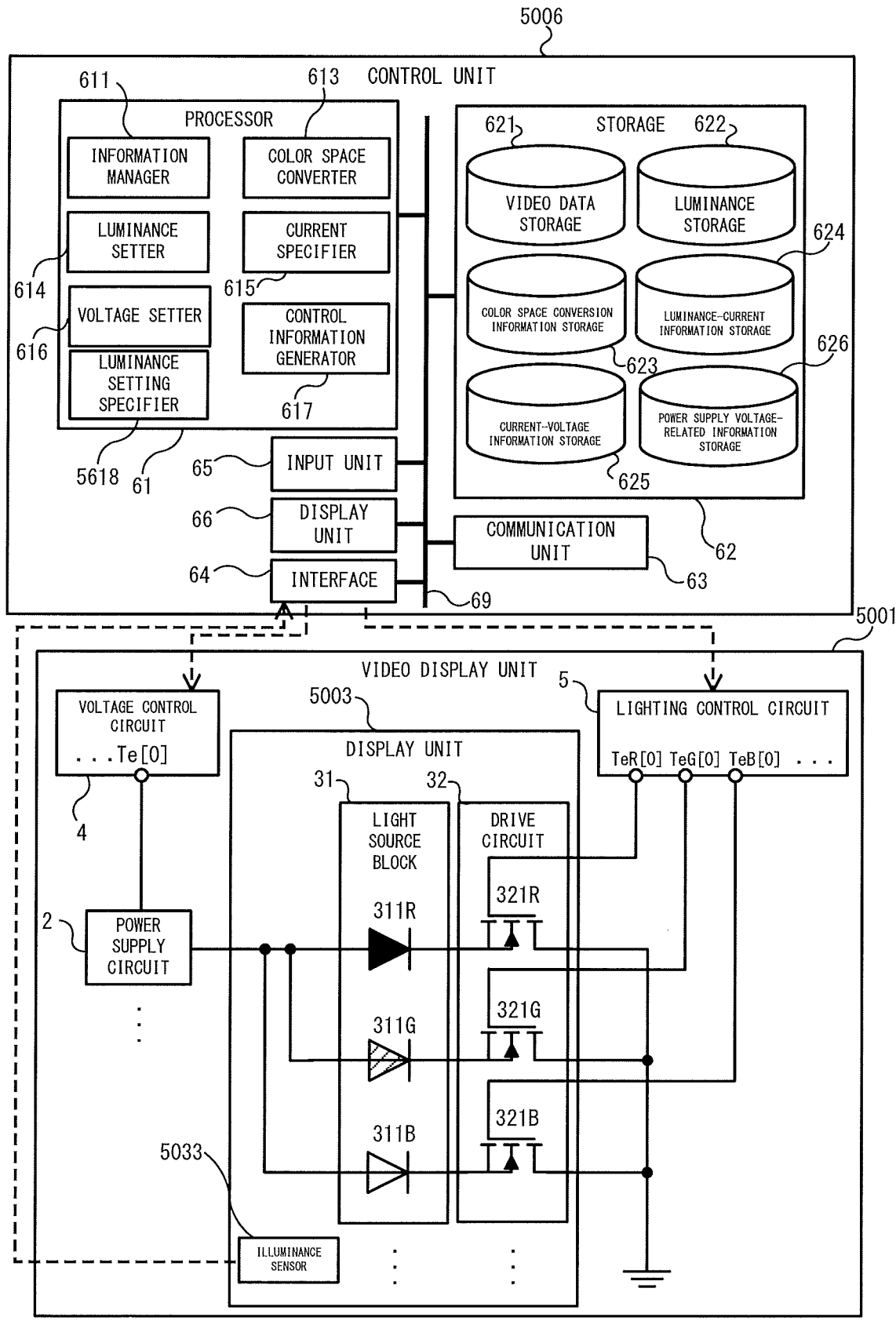
FIG. 10 is a block diagram illustrating a configuration of a display device according to still yet another variation.

The video display unit 1 according to the above-described embodiments may include an illuminance sensor for detecting ambient illuminance around the display unit 3. As illustrated in FIG. 10, a display unit 5003 of the video display unit 5001 according to this variation includes an illuminance sensor 5033 for detecting ambient illuminance around the display unit 5003. The illuminance sensor 5033 sends a detection signal dependent on the ambient illuminance around the display unit 5003 to the interface 64 of the control unit 5006. The interface 64 converts the detection signal received from the illuminance sensor 5033 into illuminance information, and sends the illuminance information to the processor 61.

The luminance storage 622 of the control unit 5006 stores, in addition to the luminance settings, a luminance settings table as illustrated in FIG. 11. The luminance settings table associates a range of illuminance detected by the illuminance sensor 5033 with the luminance setting. In this luminance settings table, the luminance settings are set to increase as the ambient illuminance around the display unit 3 increases. In the example illustrated in FIG. 11, the following relation is met for the illuminance: S1<S2< . . . SK< . . . , and the following relation is met for the luminance settings: Y(SUM)[0]<Y(SUM)[1]< . . . <Y(SUM)[k]< . . . .

The control unit 5006 includes a luminance settings specifier 5618 for referring to the luminance setting table and specifying a luminance setting corresponding to a range of illuminance that includes the illuminance indicated by the illuminance information acquired via the interface 64 from the illuminance sensor 5033. The information manager 611 updates the luminance setting stored in the luminance storage 622 with the luminance setting specified by the luminance settings specifier 5618.

This configuration achieves the optimum luminance settings in relation to the ambient illuminance around the display unit 5003, thereby advantageously maintaining the image quality of the display unit 5003.

The examples of the current control elements 321R, 321G, and 321B may include a FET and/or a bipolar transistor as described in the above-described embodiments, but are limited thereto. The current control elements 321R, 321G, and 321B may include a variable resistor having a resistance that varies in accordance with the output voltage of the lighting control circuit 5.

Although the above-described embodiments describe examples of the luminance-current information storage 624 that stores the luminance-current correlation tables, the luminance-current correlation information stored in the luminance-current information storage 624 is not limited thereto. The luminance-current correlation information may be information indicating configuration of relationships or values of a coefficient included in the relationships that indicate the correlations between the luminances of the light-emitting elements 311R, 311G, and 311B and the current values of current through the light-emitting elements 311R, 311G, and 311B. In addition, although the above-described embodiments describe examples of the current-voltage information storage 625 that stores the current-voltage tables, the current-voltage correlation information stored in the current-voltage information storage 625 is not limited thereto. The current-voltage correlation information may be information indicating configuration of relationships or values of a coefficient included in the relationships that indicate the correlations between the current values of current through the light-emitting elements 311R, 311G, and 311B and the forward voltages of the light-emitting elements 311R, 311G, and 311B.

In the above-described embodiments, the lighting control circuit 5 and the drive circuit 32 may be implemented as a single integrated circuit (IC) package.

Various functions of the control unit 6 according to the present disclosure may be implemented using a general computer system instead of the dedicated system. The control unit 6 may be, for example, configured to execute the above-described processing with a program installed on a computer system including a computer connected to a network, through distribution of the program stored in a non-transitory computer-system-readable recording medium (a CD-ROM, a magnetic disk, etc.).

The program may be provided onto the computer in any way. For example, the program may be uploaded to a bulletin board system (BBS) on a communication line and distributed through the communication line to the computer. The computer then starts the program, and executes the program as with the other applications under operating system (OS) control. The computer thereby serves as the control unit 6 that executes the above-described processing.

Although the various embodiments and variations (including supplementary descriptions, the same applying hereinafter) of the present disclosure are provided, the present disclosure is not limited thereto. The present disclosure includes appropriate combinations of the embodiments and variations, and appropriate modifications thereof.

This application claims the benefit of Japanese patent Application No. 2016-017781, filed on Feb. 2, 2016, the entire disclosure of which is incorporated by reference herein.

INDUSTRIAL APPLICABILITY

The present disclosure can be preferably applied to a display device.

REFERENCE SIGNS LIST 1, 2001, 3001, 4001, 5001 Video display unit
2, 2002R, 2002G, 2002B Power supply circuit
3, 3003, 5003 Display unit
4, 2004, 4007 Voltage control circuit
5, 3005 Lighting control circuit
6, 3006, 4006, 5006 Control unit
31 Light source block
32, 3032 Drive circuit
61 Processor 62 Storage
63 Communication unit
64 Interface
65 Input unit
66 Display unit
69 Bus
311R, 311G, and 311B Light-emitting element
321R, 321G, 321B, 4071R, 4071G, and 4071B Current control element
322R, 322G, and 322B Switching element
611 Information manager
613 Color space converter
614 Luminance setter
615 Current specifier
616 Voltage setter
617 Control information generator
621 Video data storage
622 Luminance storage
623 Color space conversion information storage
624 Luminance-current information storage
625 Current-voltage information storage
626 Power supply voltage-related information storage
3624 Luminance-current-pulse information storage
5033 Illuminance sensor
5618 Luminance settings specifier

The invention claimed is:

1. A display device, comprising:
a light-emitting element;
a transistor connected in series with the light-emitting element to control a current through the light-emitting element;
a power supply circuit to apply a voltage to a series circuit that comprises the light-emitting element and the transistor;
a voltage control circuit to control an output voltage of the power supply circuit to reach a voltage value determined in accordance with a forward voltage of the light-emitting element;
a luminance-current information storage to store luminance-current correlation information indicating a correlation between a luminance of the light-emitting element and a current value of the current through the light-emitting element;
a current-voltage information storage to store current-voltage correlation information indicating a correlation between the current value of the current through the light-emitting element and the forward voltage of the light-emitting element;
a luminance setter to set the luminance of the light-emitting element;
a current specifier to refer to the luminance-current correlation information and specify the current value of the current through the light-emitting element, the current value corresponding to the luminance set by the luminance setter; and
a voltage setter to refer to the current-voltage correlation information, specify the forward voltage of the light-emitting element corresponding to the current value specified by the current specifier, and set based on the specified forward voltage the voltage value of the voltage that is to be output by the power supply circuit,
wherein:
the voltage control circuit controls the output voltage of the power supply circuit to reach the voltage value set by the voltage setter;
the light-emitting element is one of a plurality of light-emitting elements including a first light-emitting element that emits light having a wavelength band of red light, a second light-emitting element that emits light having a wavelength band of green light, and a third light-emitting element that emits light having a wavelength band of blue light,
the display device further comprises light source blocks each including the first light-emitting element, the second light-emitting element, and the third light-emitting element,
the luminance-current information storage stores first luminance-current correlation information for the first light-emitting element, second luminance-current correlation information for the second light-emitting element, and third luminance-current correlation information for the third light-emitting element, and
the current specifier (i) refers to the first luminance-current correlation information and specifies a current value of current through the first light-emitting element, the current value corresponding to a luminance of the first light-emitting element set by the luminance setter, (ii) refers to the second luminance-current correlation information and specifies a current value of current through the second light-emitting element, the current value corresponding to a luminance of the second light-emitting element set by the luminance setter, and (iii) refers to the third luminance-current correlation information and specifies a current value of current through the third light-emitting element, the current value corresponding to a luminance of the third light-emitting element set by the luminance setter;
the display device further comprising:
a pixel value information storage to store pixel value information indicating pixel values in an RGB color system for the corresponding light source blocks;
a color space conversion information storage to store information regarding a conversion equation for converting the pixel values in the RGB color system into coordinate values in an XYZ color system;
a luminance storage to store an overall luminance setting of the light source blocks, the luminance setting being specified by a user; and
a color space converter to calculate the coordinate values in the XYZ color system from the pixel values in the RGB color system using the conversion equation,
wherein the luminance setter sets the luminances of the first light-emitting element, the second light-emitting element, and the third light-emitting element of each of the light source blocks so that a sum of Y-coordinate values in the XYZ color system for the corresponding light source blocks is equal to the luminance setting.

2. A display device, comprising:
a light-emitting element;
a transistor connected in series with the light-emitting element to control a current through the light-emitting element;
a power supply circuit to apply a voltage to a series circuit that comprises the light-emitting element and the transistor; and
a voltage control circuit to control an output voltage of the power supply circuit to reach a voltage value determined in accordance with a forward voltage of the light-emitting element,
a luminance-current information storage to store luminance-current correlation information indicating a correlation between a luminance of the light-emitting element and a current value of the current through the light-emitting element;

a current-voltage information storage to store current-voltage correlation information indicating a correlation between the current value of the current through the light-emitting element and the forward voltage of the light-emitting element;

a luminance setter to set the luminance of the light-emitting element;

a current specifier to refer to the luminance-current correlation information and specify the current value of the current through the light-emitting element, the current value corresponding to the luminance set by the luminance setter; and a voltage setter to refer to the current-voltage correlation information, specify the forward voltage of the light-emitting element corresponding to the current value specified by the current specifier, and set based on the specified forward voltage the voltage value of the voltage that is to be output by the power supply circuit, wherein:

the voltage control circuit controls the output voltage of the power supply circuit to reach the voltage value set by the voltage setter, the light-emitting element is one of a plurality of light-emitting elements including a first light-emitting element that emits light having a wavelength band of red light, a second light-emitting element that emits light having a wavelength band of green light, and a third light-emitting element that emits light having a wavelength band of blue light, the display device further comprises light source blocks each including the first light-emitting element, the second light-emitting element, and the third light-emitting element, the luminance-current information storage stores first luminance-current correlation information for the first light-emitting element, second luminance-current correlation information for the second light-emitting element, and third luminance-current correlation information for the third light-emitting element, the current specifier (i) refers to the first luminance-current correlation information and specifies a current value of current through the first light-emitting element, the current value corresponding to a luminance of the first light-emitting element set by the luminance setter, (ii) refers to the second luminance-current correlation information and specifies a current value of current through the second light-emitting element, the current value corresponding to a luminance of the second light-emitting element set by the luminance setter, and (iii) refers to the third luminance-current correlation information and specifies a current value of current through the third light-emitting element, the current value corresponding to a luminance of the third light-emitting element set by the luminance setter, the power supply circuit is one of a plurality of power supply circuits, one being provided for each of the light source blocks, and the voltage setter sets the output voltage of each power supply circuit based on a voltage value that is the highest among forward voltages of the first light-emitting element, the second light-emitting element, and the third light-emitting element for each of the corresponding light source blocks.

3. The display device according to claim 1, wherein the light-emitting element includes a pn junction.

4. A display method for a display device comprising:
a light-emitting element;

a transistor connected in series with the light-emitting element to control a current through the light-emitting element;

a power supply circuit to apply a voltage to a series circuit that comprises the light-emitting element and the transistor; and a voltage control circuit to control an output voltage of the power supply circuit to reach a voltage value determined in accordance with a forward voltage of the light-emitting element, a luminance-current information storage to store luminance-current correlation information indicating a correlation between a luminance of the light-emitting element and a current value of the current through the light-emitting element;

a current-voltage information storage to store current-voltage correlation information indicating a correlation between the current value of the current through the light-emitting element and the forward voltage of the light-emitting element;

a luminance setter to set the luminance of the light-emitting element;

a current specifier to refer to the luminance-current correlation information and specify the current value of the current through the light-emitting element, the current value corresponding to the luminance set by the luminance setter; and a voltage setter to refer to the current-voltage correlation information, specify the forward voltage of the light-emitting element corresponding to the current value specified by the current specifier, and set based on the specified forward voltage the voltage value of the voltage that is to be output by the power supply circuit, wherein:

the voltage control circuit controls the output voltage of the power supply circuit to reach the voltage value set by the voltage setter, the light-emitting element is one of a plurality of light-emitting elements including a first light-emitting element that emits light having a wavelength band of red light, a second light-emitting element that emits light having a wavelength band of green light, and a third light-emitting element that emits light having a wavelength band of blue light, the display device further comprises light source blocks each including the first light-emitting element, the second light-emitting element, and the third light-emitting element, the luminance-current information storage stores first luminance-current correlation information for the first light-emitting element, second luminance-current correlation information for the second light-emitting element, and third luminance-current correlation information for the third light-emitting element, and the current specifier (i) refers to the first luminance-current correlation information and specifies a current value of current through the first light-emitting element, the current value corresponding to a luminance of the first light-emitting element set by the luminance setter, (ii) refers to the second luminance-current correlation information and specifies a current value of current through the second light-emitting element, the current value corresponding to a luminance of the second light-emitting element set by the luminance setter, and (iii) refers to the third luminance-current correlation information and specifies a current value of current through the third light-emitting element, the current value corresponding to a luminance of the third light-emitting element set by the luminance setter, the power supply circuit is one of a plurality of power supply circuits, one being provided for each of the light source blocks, and the voltage setter sets the output voltage of each power supply circuit based on a voltage value that is the highest among forward voltages of the first light-emitting element, the second light-emitting element, and the third light-emitting element for each of the corresponding light source blocks, the method comprising:

setting the luminance of the light-emitting element;

referring to the luminance-current correlation information indicating the correlation between the luminance of the light-emitting element and the current value of the current through the light-emitting element, and specifying the current value of the current through the light-emitting element corresponding to the set luminance; and referring to the current-voltage correlation information indicating the correlation between the current value of the current through the light-emitting element and the forward voltage of the light-emitting element and specifying the forward voltage of the light-emitting element corresponding to the specified current value, and setting based on the specified forward voltage the voltage value of the voltage output by the power supply circuit for applying the voltage to the series circuit that comprises the light-emitting element and the transistor connected in series with the light-emitting element to control the current through the light-emitting element.

5. The display device according to claim 1, wherein the power supply circuit is one of a plurality of power supply circuits, one being provided for each of the light source blocks, and the voltage setter sets the output voltage of each power supply circuit based on a voltage value that is the highest among forward voltages of the first light-emitting element, the second light-emitting element, and the third light-emitting element for each of the corresponding light source blocks.

6. The display device according to claim 1, wherein the voltage value is determined by a summation of the forward voltage of the light-emitting element and a margin voltage value.

7. The display device according to claim 2, wherein the light-emitting element includes a pn junction.

8. The display device according to claim 2, wherein the voltage value is determined by a summation of the forward voltage of the light-emitting element and a margin voltage value.

* * * * *